(12) United States Patent
Chiang et al.

(10) Patent No.: US 8,257,808 B2
(45) Date of Patent: Sep. 4, 2012

(54) ELECTRONIC DEVICE HOUSING

(75) Inventors: Chwan-Hwa Chiang, Taipei Hsien (TW); Qi-Jian Du, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 120 days.

(21) Appl. No.: 12/891,904

(22) Filed: Sep. 28, 2010

(65) Prior Publication Data

US 2011/0143062 A1 Jun. 16, 2011

(30) Foreign Application Priority Data

Dec. 14, 2009 (CN) .......................... 2009 1 0311406

(51) Int. Cl.
*B28B 11/00* (2006.01)
(52) U.S. Cl. ...................................... 428/34.4; 428/34.6

(58) Field of Classification Search ................. 428/34.4, 428/34.6, 36.9, 36.91, 626, 627, 629, 628
See application file for complete search history.

(56) References Cited

U.S. PATENT DOCUMENTS

| 8,076,011 | B2 * | 12/2011 | Chiang et al. | 428/696 |
| 2011/0143062 | A1 * | 6/2011 | Chiang et al. | 428/34.6 |
| 2011/0159277 | A1 * | 6/2011 | Chiang et al. | 428/336 |

* cited by examiner

*Primary Examiner* — N. Edwards
(74) *Attorney, Agent, or Firm* — Altis Law Group, Inc.

(57) ABSTRACT

An electronic device housing includes a substrate and a metallic coating formed on the substrate. The substrate has a surface roughness of less than 60 nm. The metallic coating includes a plurality of first layers and a plurality of second layers. Each one of the first layers and each one of the second layers are alternately deposited on each other. The first layer and the second layer may be respectively tantalum pentoxide layer and silicon dioxide layer or may be respectively niobium pentoxide layer and zirconium dioxide layer.

13 Claims, 2 Drawing Sheets

ELECTRONIC DEVICE HOUSING

BACKGROUND

1. Technical Field

The present disclosure relates to an electronic device housing, particularly to an electronic device housing having a metallic and glossy appearance.

2. Description of Related Art

Decorative metallic coatings are usually deposited on housings of electronic devices. The metallic coatings are typically formed by vacuum deposition to be nonconductive so as not to block electromagnetic waves. These metallic coatings may be transparent or translucent. However, the metallic coating is generally has a semigloss or flat finish.

Therefore, there is room for improvement within the art.

BRIEF DESCRIPTION OF THE FIGURES

Many aspects of the electronic device housing can be better understood with reference to the following figures. The components in the figures are not necessarily drawn to scale, the emphasis instead being placed upon clearly illustrating the principles of the electronic device housing. Moreover, in the drawings like reference numerals designate corresponding parts throughout the several views.

DETAILED DESCRIPTION

Figure 1:
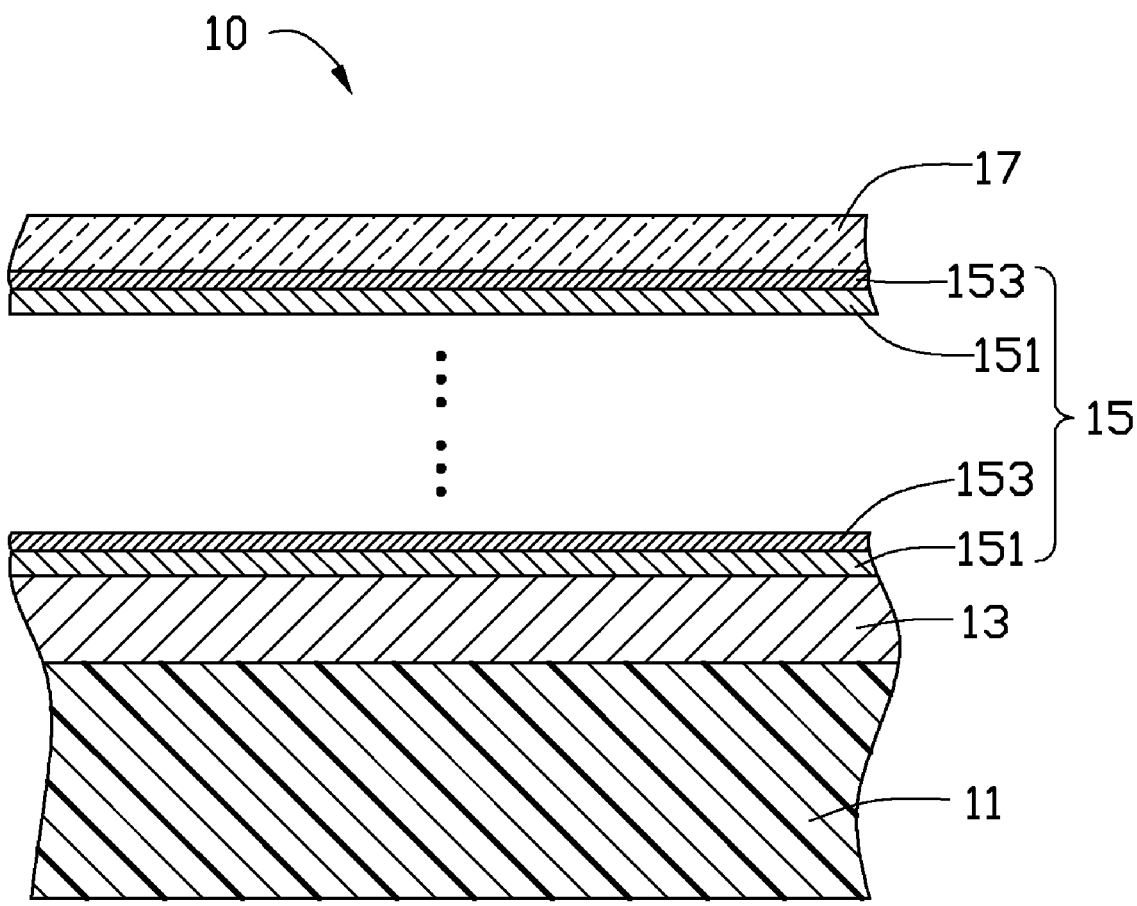
FIG. 1 is a cross-section of an exemplary embodiment of an electronic device housing.
Figure 2:
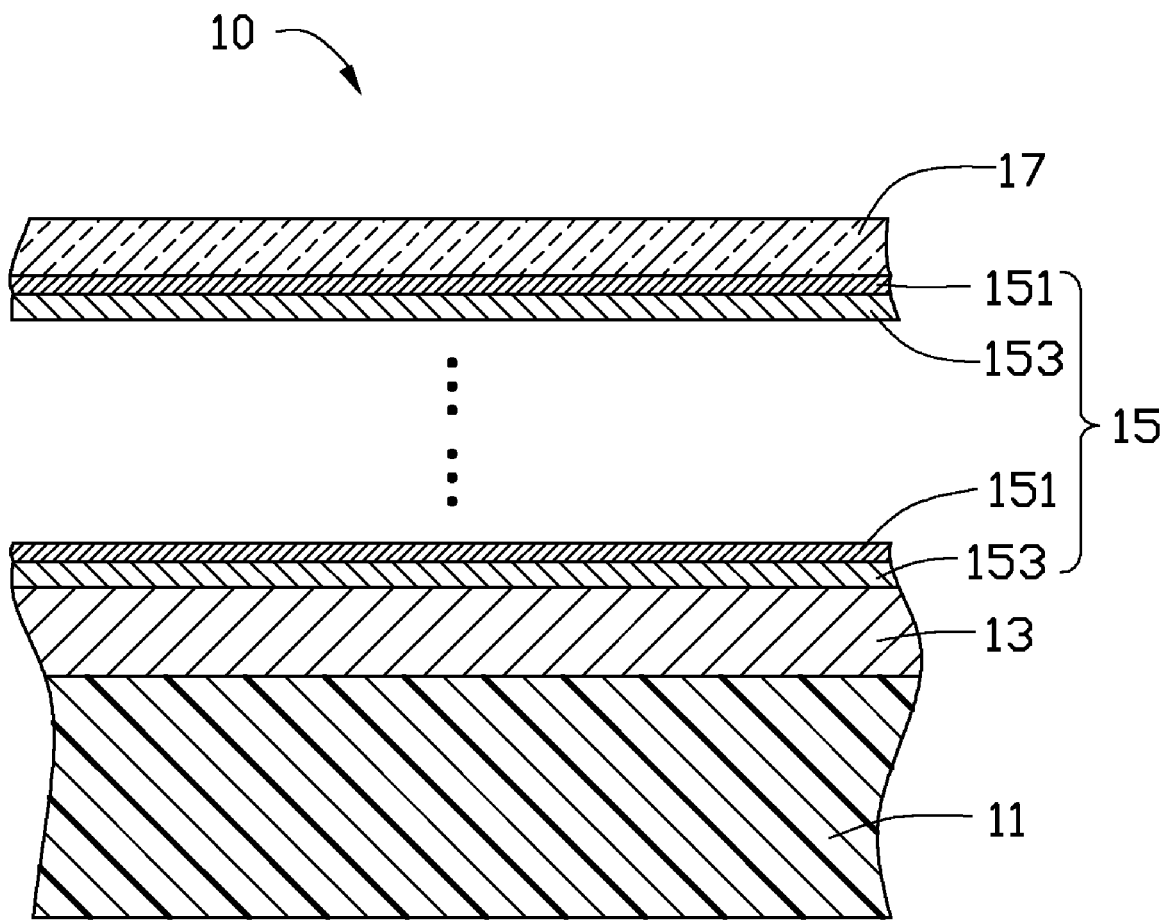
FIG. 2 is an another cross-section of an exemplary embodiment of an electronic device housing.

FIG. 1 and FIG. 2 show an electronic device housing 10 according to an exemplary embodiment. The electronic device housing 10 includes a substrate 11, a base paint coating 13 formed on a surface of the substrate 11, a metallic coating 15 formed on the base paint coating 13, and a top paint coating 17 formed on the metallic coating 15.

The substrate 11 may be made of an opaque plastic material selected from a group consisting of polypropylene (PP), polyamide (PA), polycarbonate (PC), polyethylene terephthalate (PET), and polymethyl methacrylate (PMMA). Alternatively, the substrate 11 may be made of ceramic. The substrate 11 has a flat surface with a surface roughness of less than 60 nm. The flat surface of the substrate 11 with such a surface roughness cannot affect the gloss of the metallic coating 15. The substrate 11 may be white.

The base paint coating 13 may be an acrylic resin paint coating. The base paint coating 13 may have a thickness of about 1 µm to about 30 µm. The base paint coating 13 enhances the bonding between the substrate 11 and the metallic coating 15.

The metallic coating 15 may be formed on the base paint coating 13 by vacuum sputtering. The metallic coating 15 may include a plurality of first layers 151 and a plurality of second layers 153. Each one of the first layers 151 and each one of the second layers 153 are alternately deposited on each other. The plurality of first layers 151 may include three or four layers. The plurality of second layers 153 may also include three or four layers. The first layer 151 and the second layer 153 may be respectively tantalum pentoxide ($Ta_2O_5$) layer and silicon dioxide ($SiO_2$) layer. Either one of the tantalum pentoxide layers or either one of the silicon dioxide layers may be directly formed on the base paint coating 13. Alternatively, the first layer 151 and the second layer 153 may also be respectively niobium pentoxide ($Nb_2O_5$) layer and zirconium dioxide ($ZrO_2$) layer. Either one of the niobium pentoxide layers or either one of the zirconium dioxide layers may be directly formed on the base paint coating 13.

The total thickness of the metallic coating 15 may be of about 10-1000 nm. The glossiness of the metallic coating 15 can be 100-200 GU (the angle of the incident light is about 60 degrees during a gloss test), much higher than for the conventional metallic coatings. Additionally, the metallic coating 15 has a coating material selection and coating thickness control with a metallic appearance and is nonconductive and also does not block excessive radio signals.

The target material used for vacuum sputtering the metallic coating 15 can be tantalum, niobium, zirconium or silicon. The gas used for forming the metallic coating 15 is oxygen (having a purity of about 99.99%).

The top coating 17 may be a transparent paint coating having a thickness of about 10-50 µm. The paint used for forming the top coating 17 may be an ultraviolet (UV) curable paint. The top coating 17 has high hardness properties that protects the metallic coating 15 from abrasion. The paint used for the top coating 17 can be tinted for aesthetic reasons as long as it maintains its transparency.

The base coating 13 is used as a bonding agent between the metallic coating 15 and the substrate 11 but may be omitted in applications that allows a bond to be formed by directly applying the metallic coating 15 on the substrate 11.

It is to be understood that the top coating 17 may be omitted in applications where abrasion of the electronic device housing 10 is not a concern.

It should be understood, however, that though numerous characteristics and advantages of the present embodiments have been set forth in the foregoing description, together with details of functions of the embodiments, the disclosure is illustrative only, and changes may be made in detail within the principles of the disclosure to the full extent indicated by the broad general meaning of the terms in which the appended claims are expressed.

What is claimed is:

1. An electronic device housing, comprising:
    a substrate having a surface roughness of less than 60 nm; and
    a metallic coating formed on the substrate, the metallic coating comprising:
    a plurality of first layers and a plurality of second layers, each one of the first layers and each one of the second layers being alternately deposited on each other;
    wherein the first layer and the second layer are respectively tantalum pentoxide layer and silicon dioxide layer, or are respectively niobium pentoxide layer and zirconium dioxide layer.

2. The electronic device housing as claimed in claim 1, wherein the metallic coating has a thickness of about 10-1000 nm.

3. The electronic device housing as claimed in claim 1, wherein the metallic coating has a glossiness of about 100-200 GU.

4. The electronic device housing as claimed in claim 1, wherein the metallic coating is formed by vacuum sputtering.

5. The electronic device housing as claimed in claim 1, wherein the substrate is made of plastic or ceramic.

6. The electronic device housing as claimed in claim 5, wherein the plastic is selected from a group consisting of polypropylene, polyamide, polycarbonate, polyethylene terephthalate, and polymethyl methacrylate.

7. The electronic device housing as claimed in claim 1, wherein the plurality of first layers include three or four layers, the plurality of second layers include three or four layers.

8. The electronic device housing as claimed in claim 1, further comprising a base paint coating formed between the substrate and the metallic coating.

9. The electronic device housing as claimed in claim 8, wherein the base paint coating is an acrylic resin paint coating and has a thickness of about 1-30 μm.

10. The electronic device housing as claimed in claim 8, wherein one of the tantalum pentoxide layers or one of the silicon dioxide layers is directly formed on the base paint coating.

11. The electronic device housing as claimed in claim 8, wherein one of the niobium pentoxide layers or one of the zirconium dioxide layers is directly formed on the base paint coating.

12. The electronic device housing as claimed in claim 1, further comprising a top paint coating formed on the metallic coating.

13. The electronic device housing as claimed in claim 12, wherein the top paint coating is an ultraviolet curable paint coating.

\* \* \* \* \*